(12) United States Patent  (10) Patent No.: US 8,294,117 B2
Kruit et al.  (45) Date of Patent: Oct. 23, 2012

(54) MULTIPLE BEAM CHARGED PARTICLE OPTICAL SYSTEM

(75) Inventors: Pieter Kruit, Delft (NL); Aernout Christiaan Zonnevylle, Utrecht (NL)

(73) Assignee: Mapper Lithography IP B.V., Delft (NL)

( * ) Notice: Subject to any disclaimer, the term of this patent is extended or adjusted under 35 U.S.C. 154(b) by 180 days.

(21) Appl. No.: 12/885,380

(22) Filed: Sep. 17, 2010

(65) Prior Publication Data

US 2011/0068276 A1    Mar. 24, 2011

Related U.S. Application Data

(60) Provisional application No. 61/243,948, filed on Sep. 18, 2009.

(51) Int. Cl.
G21K 1/08 (2006.01)
(52) U.S. Cl. .................. 250/396 R; 250/306; 250/492.1; 250/492.2; 250/492.21; 250/492.22
(58) Field of Classification Search .................. 250/306, 250/307, 310, 311, 396 R, 396 ML, 492.1–492.3
See application file for complete search history.

(56) References Cited

U.S. PATENT DOCUMENTS

2009/0212229 A1* 8/2009 Wieland et al. ........... 250/396 R

FOREIGN PATENT DOCUMENTS

| EP | 1 432 008 A1 | 6/2004 |
| JP | 5 251315 A | 9/1993 |
| WO | WO 2007/013802 A1 | 2/2007 |
| WO | WO 2008/013442 A1 | 1/2008 |

* cited by examiner

Primary Examiner — Michael Maskell
(74) Attorney, Agent, or Firm — Blakely, Sokoloff, Taylor & Zafman

(57) ABSTRACT

The invention relates to a multiple beam charged particle optical system comprising:
   a charged particle source for generating a plurality of charged particle beamlets, and
   charged particle optics for directing the charged particle beamlets from the charged particle source towards a target, wherein each charged particle beamlet defines a beamlet center line, said charged particle optics comprising one or more electrostatic lens arrays, each comprising two or more array electrodes for generating a plurality of electrostatic lenslets, wherein each lenslet is arranged for focusing a corresponding charged particle beamlet, and wherein each lenslet defines a lenslet optical axis, wherein at least one of said one or more electrostatic lens arrays comprises one or more off-axis electrostatic lenslets, wherein the beamlet center line of the corresponding charged particle beamlet passes through said off-axis electrostatic lenslet at a distance from its lenslet optical axis.

32 Claims, 10 Drawing Sheets

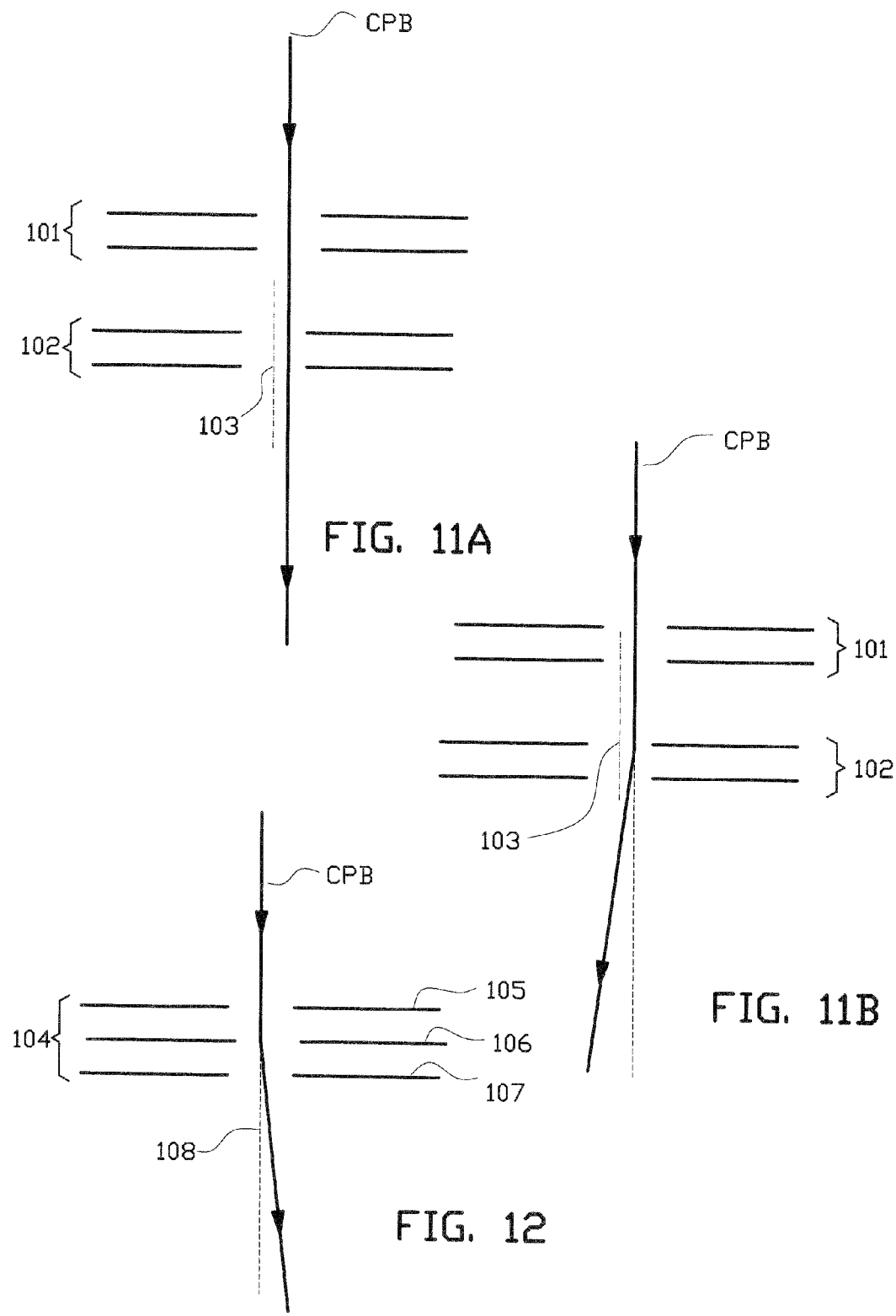

MULTIPLE BEAM CHARGED PARTICLE OPTICAL SYSTEM

This is a non-provisional application claiming the benefit of U.S. Provisional Application No. 61/243,948 filed Sep. 18, 2009.

BACKGROUND

The invention relates to a multiple beam charged particle optical system comprising:

a charged particle source for generating a plurality of charged particle beamlets, charged particle optics for directing the charged particle beamlets from the charged particle source towards a target, said charged particle optics comprising one or more electrostatic lens arrays, each comprising two or more array electrodes for generating a plurality of electrostatic lenslets, wherein each lenslet is arranged for focusing a corresponding charged particle beamlet.

Such a system is for example employed in a maskless charged particle beam lithography assembly for projecting one or more charged particle beamlets onto a target for writing an image or pattern onto said target.

PRIOR ART

One example of such a system, disclosed in WO2007/013802, comprises a charged particle column operating in vacuum with a charged particle source including a charged particle extraction means, a means for creating a plurality of parallel beamlets from a diverging beam of said extracted charged particles and a plurality of electrostatic lens structures comprising electrodes. The electrostatic lens structures serve amongst other the purpose of focusing the beamlets. Blanking in this is realized by deflecting one or a multiplicity of such usually focused charged particle beams by a modulator array. This modulator array only deflects one or more particles beamlets, which deflected beamlets are stopped by a stop array to prevent the particle beam or multiplicity of beamlets from reaching the target such as a wafer. For realizing the final part of the projection of a computer based image pattern on said target, non blanked beamlets are, at a final set of such electrostatic lenses, deflected in a so-called writing direction as part of said imaging process of said target.

On the one hand, the charged particle optics of such a system comprises so called macro lenses for focusing the diverging beam or the assembly of beamlets.

On the other hand, the charged particle optics comprises one or more electrostatic lens arrays, each comprising a plurality of electrostatic lenslets, wherein each lenslet is arranged for focusing a corresponding charged particle beamlet. A lenslet is literally a small lens. The fact that distinguishes it from a small lens is that it is part of a lenslet array. A lenslet array consists of a set of lenslets in the same plane. Each lenslet of such a lenslet array normally has the same focal length.

Furthermore, the charged particle optics may comprise one or more beam limiting apertures and/or aperture arrays.

A complication towards successful exposure lies in the fact that all components of the charged particle optics need to be highly accurate positioned in order guide the beamlets towards the desired position on the target. A further complication for obtaining high resolution exposures lies in the fact that charged particle lenses, magnetic and/or electrostatic lenses, suffer from aberrations, in particular spherical aberrations. Known lens structures or lens systems for at least partially correcting such aberrations are highly complex. In this respect it would be highly desirable to be able to correct for lens aberrations and/or to correct for deviations in the position of the beamlets.

During projection, in accordance with the concept of the known system, a target is guided relative to the projection area of said charged particle column, by means of a moveable support, said support moving in a direction other than that of said final projection deflection of the beamlets, commonly transversely thereto. In this process very high accuracy is of prime importance, implying complex and expensive actuation and positioning means. Due to limits in focus depth of the charged particle beams, the small dimensions of the patterns to be written and the thickness variations of the target itself, the relative positioning of the target is crucial for a successful exposure thereof and should be performed highly precise over a wide range of motion.

A further complication towards successful exposure lies in the fact that while the known charged particle system has means to compensate for errors in the XY-plane of the target using the deflection in the writing direction and the movement of the target holder, it is unable to correct for rotational errors using said deflection and movement of the target holder. Said rotational errors, originating from misalignment around the Z-axis of the projection system and target, in fact from insufficient accuracy in the guidance of the stage in the X- and Y-direction respectively, ultimately result in a position error with this effect being increased when projection takes place further away from the centre of rotation, thereby increasing the accuracy requirements with regard to rotational errors for the target positioning system even further. Said rotational accuracy requirements are typically an order of magnitude higher in comparison with the accuracy requirements in the plane of the target.

SUMMARY OF THE INVENTION

It is an object of the present invention to improve lithography systems described above, in particular to mitigate at least part of the effect of part of the disadvantages mentioned.

It is further an object of the present invention to provide the charged particle optics with means for at least partially correct small deviations in position of the beamlets and/or to correct for lens aberrations.

It is further an object of the present invention to provide a versatile system that has various possibilities of correcting deviations and/or aberrations of the beam and/or beamlets.

A further object is to design a system that can combine at least part of these possibilities.

It is a further object of the present invention to reduce the accuracy requirement of the movable support.

According to a first aspect, the present invention provides a charged particle optical system comprising:

a charged particle source for generating a plurality of charged particle beamlets, charged particle optics for directing the charged particle beamlets from the charged particle source towards a target, wherein each charged particle beamlet defines a beamlet centre line, said charged particle optics comprising one or more electrostatic lens arrays, each comprising two or more array electrodes for generating a plurality of electrostatic lenslets, wherein each lenslet is arranged for focusing a corresponding charged particle beamlet, and wherein each lenslet defines a lenslet optical axis, wherein at least one of said one or more electrostatic lens arrays comprises one or more off-axis electrostatic lenslets, wherein the beamlet centre line of the corresponding charged particle beamlet passes through said off-axis electrostatic lenslet at a distance from its lenslet optical axis.

Usually in charged particle optics, electrostatic lenses are arranged such that the charged particle beam moves through the centre of the electrostatic lens. Such lenses are further denoted as "on-axis electrostatic lenses". Any deviation of the charged particle beam from said centre of the electrostatic lens is avoided, because this will lead to unwanted aberrations. Examples of such a system are disclosed in EP 1 432 008. In this document it is confirmed that in general aberrations introduced by a lens system can be minimized if the beam travels through the lens on the optical axis. In the examples disclosed in EP 1 432 008 the electron beams always travel through the magnetic and/or the electric lens component substantially on-axis. Even in an example where the electron beam is deflected away from the optical axis by a first group of electrodes of a pre-lens deflection system, this system comprises a second group of electrodes that redirect the beam towards the optical axis. The two groups of deflections electrodes interact in a manner that the electron beam always travels through the lens on-axis.

Also in WO 2008/013442 A1 lens array systems are disclosed where the beamlets are symmetrical along the optical axis in order to optimize the lens with respect to resulting aberrations. In an embodiment, the lens is combined with a current limiting aperture, aligned such relative to a lens of said structure, that a virtual aperture effected by said current limiting aperture in said lens is symmetrical along the optical axis of the lens.

However, the present invention breaks with this prejudice, and describes that such a deemed adverse condition may be turned into a range of new and useful applications.

The charged particle optical system according to the invention comprises an electrostatic lens array having one or more, preferably a plurality of lenslets which are intentionally arranged such that the charged particle beamlets at least enter and preferably pass the lenslets substantially out of the centre of said lenslets, which lenslets is further denoted as "off-axis lenslets". When the electrostatic lens array is activated to be a positive lens, each lenslets it will focus the charged particle beamlets, and the off-axis lenslets will furthermore shift the charged particle beamlets towards the optical axis of said off-axis lenslet. When the electrostatic lens array is activated to be a negative lens, which requires a more complex lens structure since electrostatic lenses usually are positive lenses, each lenslet will defocus the charged particle beam, and the off-axis lenslets will furthermore shift the charged particle beamlets away from the optical axis of said off-axis lenslet.

The charged particle optical system of the invention comprises one or more off-axis lenslets, which lenslets are positioned in the optical system such that the beamlet centre line of an incoming charged particle beamlet at least enters an off-axis lenslet at a distance from its lenslet optical axis. When the off-axis lenslet is activated, thus when a non-zero potential- or voltage-difference between the electrodes of the electrostatic lens array is established, the passing beamlet is on the one hand focused or defocused, and on the other hand deflected. Said deflection provides a shift in the trajectory of the passing beamlet. The magnitude of said shift depends on the focal length of the off-axis electrostatic lenslet and can be set by adjusting the potential- or voltage-difference between the electrodes of said electrostatic lens array. Thus by adjusting the potential of said electrostatic lens array, i.e. the potential difference between the electrodes of said electrostatic lens array, the amount of shift of the charged particle beamlets which pass through an off-axis lenslet can be adjusted, for example to at least partially correct for small deviations in the position of the beamlets or of said target.

The magnitude of said shift depends also on the distance between the lenslet optical axis and the position where the beamlet passes through said off-axis lenslet. This distance can be chosen during the design of the charged particle optical system. The larger the distance, the larger the shift (when the focal length is kept constant).

By carefully designing the electrostatic lens array for the charged particle optical system, the system can for example be provided with means for at least partially correct for aberrations introduced by other lenses, in particular macro lenses. A further advantage of the electrostatic lens arrays according to the invention is, that it provides a means for manipulating the trajectory of individual beamlets using lens arrays that are fixedly arranged in the charged particle optical column.

In an embodiment, at least one of said one or more electrostatic lens arrays comprises a stack comprising a first and second array electrode provided with a first and second lens hole array respectively, wherein the lens holes of the first and second lens hole array are aligned with each other, wherein at least one of said one or more electrostatic lens arrays comprises one or more off-axis electrostatic lenslets, each off-axis lenslet comprising a first lens hole of said first lens hole array and an opposite second lens hole of said second lens hole array, and wherein the beamlet centre line of the corresponding charged particle beamlet passes through said off-axis electrostatic lenslet at a distance from a centre of said off-axis electrostatic lenslet. Preferably said beamlet centre line passes through said off-axis electrostatic lenslet at a distance from at least one of said first and second lens hole.

In an embodiment, each one or a subset of said one or more off-axis electrostatic lenslets is individually adjusted and/or arranged for providing an individual correction, or desired deflection or position of each corresponding charged particle beamlet. This provides a highly flexible electrostatic lens array which can be designed for adjusting or correcting substantially any deviation of the charged particle beamlets from a desired position. On the one hand, this may be a desired position on a target, said target may be the surface of a silicon wafer. On the other hand, this may also be a desired position on a beam limiting aperture, a beam stop or a lens plane of an other lens or electrostatic lens array of the charged particle optics. Accordingly the invention provides a simple solution for optimizing system characteristics of charged particle optics in general, and multiple beam charged particle systems in particular, for correcting aberrations such as spherical aberrations and astigmatism, for correcting edge phenomena, and the like.

In an embodiment, the charged particle optics comprises a central axis, wherein the plurality of lenslets of the at least one of said one or more electrostatic lens arrays are substantially symmetrically arranged around said central axis.

In an embodiment, the distance between the optical axis of each off-axis electrostatic lenslet and the beamlet centre line of the corresponding charged particle beamlet is a function of the radial distance between said off-axis electrostatic lenslet and the central axis.

In a first embodiment, the distance between the optical axis of each off-axis electrostatic lenslet and the beamlet centre line of the corresponding charged particle beamlet is proportional to the radial distance between said off-axis electrostatic lenslet and the central axis.

When all lenslets of an electrostatic lens array according to this first embodiment are arranged such that the distance between the optical axis of each lenslets and the beamlet centre line of the corresponding charged particle beamlet is proportional to the radial distance between said lenslets and the central axis, and each off-axis electrostatic lenslet is shifted with respect to the beamlet centre line of the corresponding charged particle beamlet in a substantially radial direction with respect to said central axis, the radial shift of the charged particle beamlets is proportional to the distance between the beamlet and the central axis.

On the one hand, such a electrostatic lens array acts as a positive macro lens for converging the assembly of beamlets, when the optical axis of each lenslet is arranged between the beamlet centre line of the corresponding charged particle beam and the central axis.

On the other hand, such a electrostatic lens array acts as a negative macro lens for diverging the assembly of beamlets, when the beamlet centre line of the corresponding charged particle beam is arranged between the optical axis of the lenslet and the central axis.

When all lenslets of an electrostatic lens array according to this first embodiment are arranged such that the distance between the optical axis of each lenslets and the beamlet centre line of the corresponding charged particle beamlet is proportional to the radial distance between said lenslets and the central axis, and each off-axis electrostatic lenslet is shifted with respect to the beamlet centre line of the corresponding charged particle beamlet in a substantially tangential direction with respect to said central axis, the tangential shift of the charged particle beamlets is proportional to the distance between the beamlet and the central axis. Such an electrostatic lens array can be used for correcting small rotational errors around the central axes of the assembly of beamlets or of the movable support.

In a second embodiment, the distance between the optical axis of each off-axis electrostatic lenslet and the beamlet centre line of the corresponding charged particle beamlet is proportional to the radial distance between said off-axis electrostatic lenslet and the central axis to the third power.

When all lenslets of an electrostatic lens array according to this second embodiment are arranged such that the distance between the optical axis of each lenslets and the beamlet centre line of the corresponding charged particle beamlet is proportional to the third power of the radial distance between said lenslets and the central axis, and each off-axis electrostatic lenslet is shifted with respect to the beamlet centre line of the corresponding charged particle beamlet in a substantially radial direction with respect to said central axis, the radial shift of the charged particle beamlets is proportional to the distance between the beamlet and the central axis to the third power. Such an electrostatic lens array can be used for correcting a spherical aberration introduced for example by an other lens, for example a collimating macro lens, of the charged particle optical system.

In a third embodiment, each off-axis electrostatic lenslet is shifted with respect to the beamlet centre line of the corresponding charged particle beamlet along substantially the same direction.

When all lenslets of an electrostatic lens array according to this third embodiment are arranged such that the distance between the optical axis of each lenslets and the beamlet centre line of the corresponding charged particle beamlet is proportional to the distance between said lenslets and line in the plane of the electrostatic lens array and transverse to the central axis, this electrostatic lens array can be used as a cylinder lens, for example for correcting any astigmatism of an other lens, for example a macro lens, of the charged particle optical system.

In a fourth embodiment, each off-axis electrostatic lenslet of a quadrant of the at least one of said one or more electrostatic lens arrays is shifted with respect to the beamlet centre line of the corresponding charged particle beamlet in substantially the same direction.

In a fifth embodiment, each off-axis electrostatic lenslet is shifted in substantially the same direction and wherein the distance between the optical axis of each off-axis electrostatic lenslet and the beamlet centre line of the corresponding charged particle beamlet is substantially constant. When all lenslets of an electrostatic lens array according to this fifth embodiment are off-axis electrostatic lenslets, this electrostatic lens array can be used as a deflector for deflecting the assembly of beamlets in said same direction, and inducing substantially the same amount of deflection for each beamlet of said assembly.

In most embodiments, the distance between the optical axis or the centre point of the off-axis lenslets and the corresponding beamlet centre line is set during the design of the electrostatic lens array. In the case that the induced deflection or shift by the off-axis electrostatic lenslets must be adjusted, the potential over the electrodes of the electrostatic lens array is adjusted. As mentioned above, this will also change the focal length of the lenslets of the electrostatic lens array. As a result, the focus point of the beamlets changes.

In an embodiment, the electrostatic lens array is arranged near or in a focal plane of said multiple charged particle beamlets. Although the off-axis lenslets induce a deflection of the corresponding charged particle beamlet, any focusing or de-focusing effect of said off-axis lenslets is minimized or substantially neutralized, such that the total focal length of the charged particle optical system is, at least substantially, being preserved.

Alternatively or in addition, any focusing or de-focusing effect of said off-axis lenslets may be neutralized by adjusting the focal length of one of more other electrostatic lenses of the charged particle optical system, such that the total focal length of the charged particle optical system is preserved.

In an embodiment, an off-axis electrostatic lenslet is embedded in, or set in front of or behind an on-axis electrostatic lenslet of said charged particle optics. The combined on-axis and off-axis lenslets can be controlled such that the total focal length of said combined lenslets is substantially constant.

In an embodiment, the stack of array electrodes of the electrostatic lens array comprises a third array electrode provided with a third lens hole array, wherein the lens holes of the first, second and third lens hole array are aligned with each other, wherein a lenslet axis of said electrostatic lens runs through the centers of said first and second lens hole, wherein each off-axis lenslet comprises a off-axis third lens hole of said third lens hole array, and wherein the center of said off-axis third lens hole is arranged at a distance from said lenslet axis. In this electrostatic lens array, the off-axis electrostatic lenslets are combined with an on-axis electrostatic lenslets, i.e. the off-axis electrostatic lenslets and the on-axis electrostatic lenslets share one or more electrodes. In this case, the off-axis electrostatic lenslet can be obtained by a single shifted third electrode with respect to the first and second electrodes of the on-axis electrostatic lenslet. Since an electrostatic lens is always a combination of positive and negative lenses, the shift of a single electrode is more effective than the shift of a whole lens.

In an embodiment, said third array electrode may comprise one or more on-axis third lens holes in combination with one or more off-axis third lens holes.

In an embodiment, the second array electrode is arranged between the first and third array electrode. The off-axis electrostatic lenslet, induced by the second and third array electrode, is following on the on-axis electrostatic lenslet, induced by the first and second array electrode.

In an embodiment, the third array electrode is arranged between the first and second array electrode. Thus the third array electrode is sandwiched between the first and second array electrode.

In an embodiment the stack of array electrodes of the electrostatic lens array comprises a fourth and fifth array electrode provided with a fourth and fifth lens hole array respectively, wherein the lens holes of the first, second, third, fourth and fifth lens hole array are aligned with each other, wherein the lenslet axis of said electrostatic lens runs through the centers of said aligned first, second, fourth and fifth lens holes, and wherein the third lens hole array is arranged in between the first and second lens hole array on the one side and the fourth and fifth lens hole array on the other side. Each off-axis electrostatic lenslet, induced by the second, third and fourth array electrode, is embedded in between a first on-axis electrostatic lenslet, induced by the first and second array electrode, and a second on-axis electrostatic lenslet, induced by the fourth and fifth array electrode.

By using a five element lens where the middle electrode, i.e. the third electrode, comprises the shifted lens holes for inducing the off-axis lenslets, the action of said off-axis lenslets can be completely turned off by applying the same voltage to the three middle electrodes, i.e. the second, third and fourth electrode array. In addition the exit kinetic energy of the incident and passed through charged particles can be kept constant, and a change in focal length induced by the off-axis lenslets can be compensated by properly adjusting the voltages of the on-axis lenslets in front of and/or behind said off-axis lenslets.

In an embodiment, the charged particle optics comprises a central axis, wherein the plurality of lenslets of the at least one of said one or more electrostatic lens arrays are substantially symmetrically arranged around said central axis.

In an embodiment, the distance between the centre of an off-axis third lens hole and said lenslet axis is a function of the radial distance between said off-axis electrostatic lenslet and the central axis.

In an embodiment, the distance between the centre of an off-axis third lens hole and said lenslet axis is proportional to the radial distance between said off-axis electrostatic lenslet and the central axis.

When all lens holes of said third lens hole array are arranged such that the distance between the centre of each third lens hole and the corresponding lenslet axis is proportional to the radial distance between the lenslet axis and the central axis, and in addition the third lens hole of each off-axis electrostatic lenslet is shifted with respect to the beamlet centre line of the corresponding charged particle beamlet in substantially the same, substantially radial direction, the resulting electrostatic lens array may acts as a positive macro lens (when the third lens holes are shifted towards the central axis) or negative macro lens (when the third lens holes are shifted away from the central axis).

When all lens holes of said third lens hole array are arranged such that the distance between the centre of each third lens hole and the corresponding lenslet axis is proportional to the radial distance between the lenslet axis and the central axis, and in addition the third lens hole of each off-axis electrostatic lenslet is shifted with respect to the beamlet centre line of the corresponding charged particle beamlet in substantially the same, substantially tangential direction, the resulting electrostatic lens array may acts as a rotation device for correcting small rotational errors in the beamlet alignment around the central axis. In an embodiment, the third lens hole array is rotated around the central axis with respect to the first and/or second lens hole array.

In an embodiment, the distance between the third lens hole and said lenslet axis is proportional to the radial distance between said off-axis electrostatic lenslet and the central axis to the third power.

When all lens holes of said third lens hole array are arranged such that the distance between the centre of each third lens hole and the corresponding lenslet axis is proportional to the third power of the radial distance between the lenslet axis and the central axis, and in addition the third lens hole of each off-axis electrostatic lenslet is shifted with respect to the beamlet centre line of the corresponding charged particle beamlet in substantially the same, substantially radial direction, the resulting electrostatic lens array may be used for correcting a spherical aberration introduced by an other lens of the charged particle optical system.

In an embodiment, the third lens hole of each off-axis electrostatic lenslet of a quadrant of the at least one of said one or more electrostatic lens arrays is shifted with respect to the beamlet centre line of the corresponding charged particle beamlet in substantially the same direction.

In an embodiment, the third lens hole of each off-axis electrostatic lenslet is shifted in substantially the same direction, and wherein the distance between the center of said third lens hole and said lenslet axis is substantially constant. When all lenslets of the electrostatic lens array according to this embodiment are off-axis electrostatic lenslets, this electrostatic lens array can be used as a deflector for deflecting the assembly of beamlets in said same direction, and inducing substantially the same amount of deflection for each beamlet of said assembly.

When all electrostatic lenslets of an electrostatic lens array are off-axis lenslets which are arranged such that the connecting line between the centre of the off-axis lenslets and the position of the corresponding charged particle beam on said off-axis lenslet is parallel to an X-axis of the movable support, said electrostatic lens array can correct small deviations in X-axis position of said target. In an embodiment said charged particle optical system may furthermore comprise a second electrostatic lens array, wherein all electrostatic lenslets are off-axis lenslets which is arranged such that the connecting line between the centre of the second off-axis lenslets and the position of the corresponding charged particle beam on said off-axis lenslets is parallel to an Y-axis of the movable support, wherein the Y-axis is substantially perpendicular to said X-axis. The second electrostatic lens array can correct small deviation in Y-axis position of said target. This combination of two off-axis electrostatic lens arrays can provide a correction along the X-axis and the Y-axis, and thus can provide a correction in the XY-plane.

In an embodiment, the system further comprises a sensor for accurately determining a deviation between an actual position and a desired position of the target, and a controller for adjusting a potential of said off-axis lenslets or said third array electrode based on the determined deviation. Thus by adjusting the potential of said off-axis lenslets or said third array electrode, by means of said controller, the charged particle beamlets can be shifted for at least partially correct small deviations in position of said target. Using one or more of the above mentioned embodiments, small deviations in the xy-plane and/or small rotational deviations can be corrected.

Sensors for detecting or measuring of the position and orientation of the target are known in the art, and may comprise highly accurate laser interferometers. Such sensors or measuring systems may operate real time and can accurately determine the position and orientation of the target relative to the charged particle optical system or also denoted as 'projection system'.

According to a second aspect, said invention provides a maskless charged particle beam lithography assembly comprising a multiple beam charged particle optical system as described above.

According to a third aspect, said invention provides an electrostatic lens array comprising comprises one or more off-axis electrostatic lenslets for use in a multiple beam charged particle optical system as described above.

According to a fourth aspect, said invention relates to a use of a multiple beam charged particle optical system as described above.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which:

FIGS. 11A and 11B show a schematic representation of an example of a combination of an on-axis and an off-axis electrostatic lenslet;

FIG. 12 shows a schematic representation of an exemplary embodiment having a three element lenslet configuration;

DETAILED DESCRIPTION OF THE INVENTION

Figure 1:
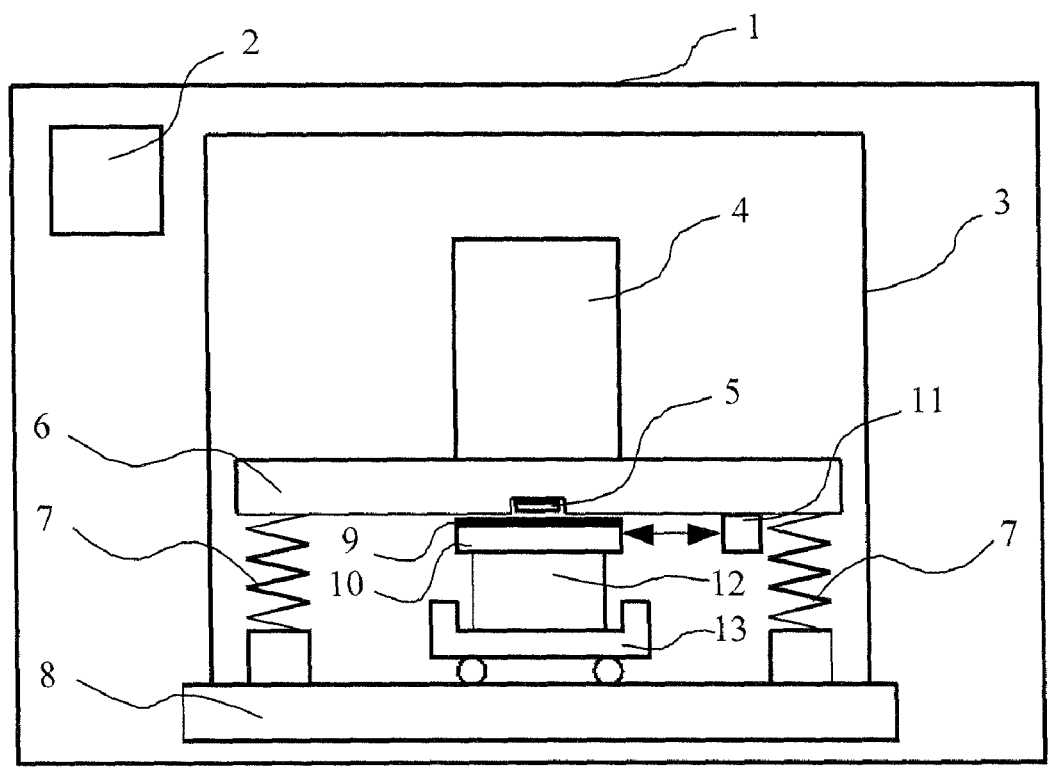
FIG. 1 shows a schematic representation of a charged particle lithography system including wafer stage components.

FIG. 1 is a schematic representation of a prior art charged particle system 1 for projecting an image or pattern, in particular an image or pattern provided by a control system 2, onto a target. In this design the charged particle system comprises a control system 2, a vacuum chamber 3 mounted on a base frame 8, which contains a charged particle column 4, a metro frame 6 and a target positioning system 10-13. The target 9 will generally be a wafer provided with a charged particle sensitive layer in the substrate plane. Target 9 is placed on top of wafer table 10, which are in turn place on chuck 12 and long stroke drive 13. Measurement system 11 is connected to metrology frame 6 and provides measurements of the relative positioning of wafer table 10 and metro frame 6. The metro frame 6 typically is of relatively high mass and is suspended by vibration isolators 7 for example embodied by spring elements in order to dampen disturbances. The electron optical column 4 performs a final projection using projector 5. The projector 5 comprises a system of either electrostatic or electromagnetic projection lenses. In the preferred embodiment as depicted the projector 5 comprises an electrostatic lens array.

Projector 5 is positioned ultimately close to target 9, i.e. within a range of 25 micron to 75 micron. In accordance with present preference said positioning distance is around, i.e. plus or minus 10%, 50 micron.

To achieve said required accuracy over a large range of motion, the wafer positioning system typically comprises a long stroke component 13 for moving the wafer stage over a relatively large distance in the scanning direction and perpendicular to the scanning direction, and a short stroke component 12 for accurately performing the positioning of the target 9 and for correcting for disturbances. Relative positioning of the wafer stage with regard to the metro frame 6 is measured by measurement system 11. Target 9 is clamped onto the wafer table 10 to ensure the fixation of the target 9 during projection.

Figure 2:
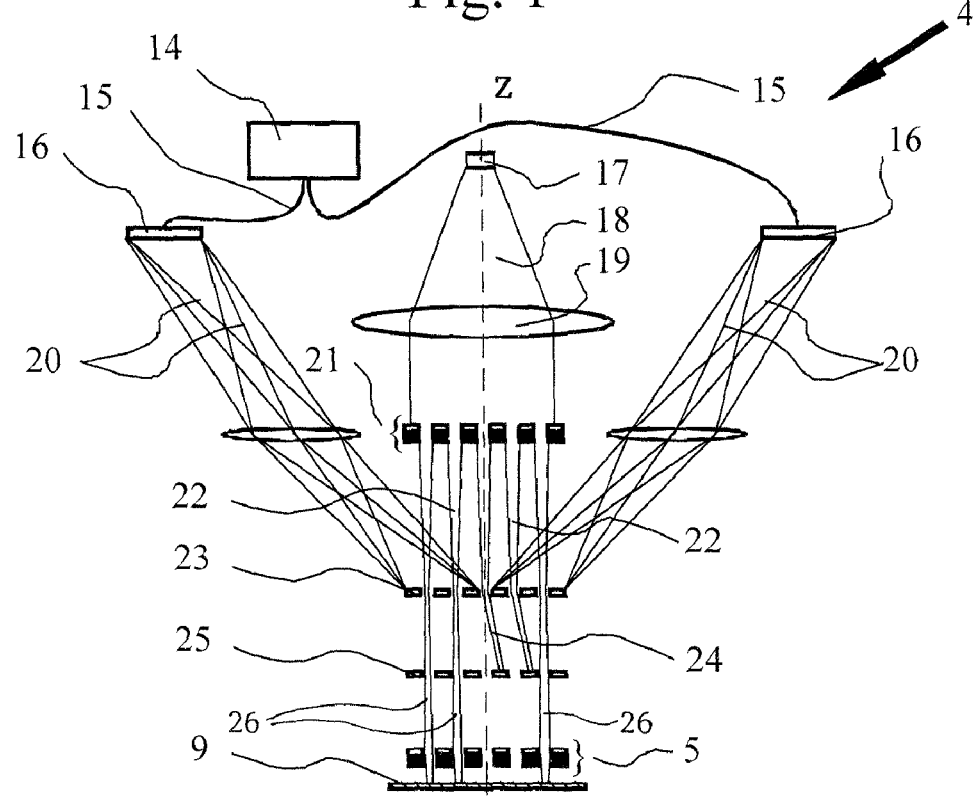
FIG. 2 shows a schematic representation of an multiple beam electron optical column of a prior art charged particle exposure system.

FIG. 2 schematically illustrates an example of a known charged particle optical system 4 known per se, having a symmetry axis Z, also denoted herein as the central axis Z of the lithography system, in particular of the charged particle optics. In the known system a charged particle source 17 generates a charged particle beam 18. The charged particle beam subsequently passes collimator lens 19 for collimating the charged particle beam. Next, the collimated charged particle beam is transformed into a plurality of beamlets 22 by an aperture array 21, comprising in the known system a plate with through-holes, by blocking part of the collimated beam and allowing the beamlets 22 to pass through. The beamlets 22 are projected on blanking means 23 which in this example comprises an array of apertures provided with deflection means. Said blanking means 23 is capable of deflecting individually selected beamlets 24 onto a beam stop 25 formed by an aperture array aligned with the array of apertures of blanker means 23, so as to let through non deflected beamlets. Such deflection of beamlets 24 onto beam stop 25 effectively switches deflected individual beamlets 24 "off", i.e. off from reaching the target. Non-deflected beamlets are able to pass through uninhibited and are thus not blanked by blanking array 23 and beam stop array 25. Control signals for said blanking array 23 are generated in pattern streamer 14 and sent as electrical signals 15 and converted into optical control signals by modulation means 16. The optical control signals 20 are sent to the blanking array 23 in order to transport the switching instructions. Projector 5 focuses the non-deflected beamlets 26 and deflects the non-deflected beamlets 26 in a writing direction on the target 9, thus realizing a final projection. Said final projection of charged particle beamlets 22 onto the target 9 enables exposure. During the exposure, said beamlets 26 are simultaneously deflecting over the target 9 in a first direction, while target 9 is moved in a second direction transversely to said first direction by an above described target positioning system 10-13.

The use of electrostatic lens arrays in multiple beam charged particle optical systems, as the example described above, is well known. Usually in charged particle optics, electrostatic lenses are arranged such that the charged particle beam moves through the centre of the electrostatic lens. Any deviation of the charged particle beam from said centre of the electrostatic lens is avoided, because this will lead to unwanted aberrations.

However, if this prejudice is dropped, this clears the way to numerous new devices for affecting and controlling charged particle beamlet arrays.

Figure 3:
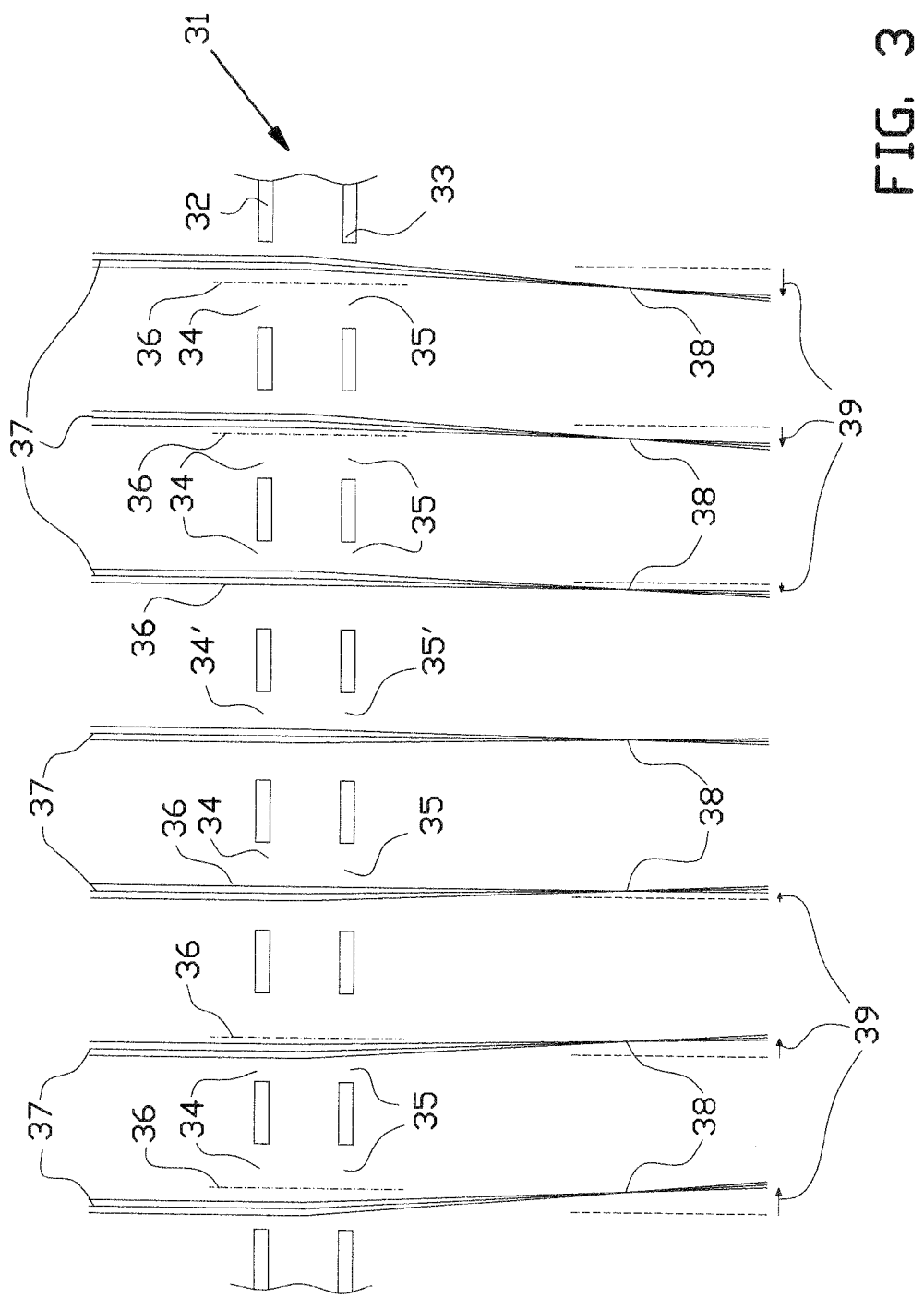
FIG. 3 shows a schematic cross-section of a first exemplary embodiment of a electrostatic lens array of the invention.

In a first example, as shown in FIG. 3, the electrostatic lens array 31 comprises a stack of a first array electrode 32, provided with an array of first lens holes 34, and a second array electrode 33, provided with an array of second lens holes 35. The lens holes 34 and 35, 34' and 35' of the first 32 and second 33 are aligned with each other to form an electrostatic lenslet having an optical axis 36. As shown in FIG. 3, the electrostatic lens array 31 is not only used for focusing the beamlets 37, but also for deflecting some of the beamlets 37.

The electrostatic lens array 31 is aligned such that centre beamlet 37' passes centrally through the lens holes 34', 35' of the electrostatic lens array 31. This beamlet 37' is only being focused by the lenslet defined by the lens holes 34', 35'.

The other lenslets defined by the lens holes 34, 35 are intentionally arranged such that each of the other beamlets 37 passes the corresponding lenslet at a distance from its optical axis 36. In the example shown in FIG. 3, each beamlet 37 is deflected by the corresponding lenslet to pass through the focal point 38 of said lenslet.

In the example shown in FIG. 3, the spacing between the lens holes 34, 35 is smaller than the spacing between the beamlets 37 (this is highly exaggerated in this figure to more clearly show the effect of deflection). Thus the shift 39 of the beamlets 37 increase with increasing distance between a beamlet 37 en the centre beamlet 37'. Since an electrostatic lens is usually a positive lens, the arrangement shown in FIG. 3 acts as a positive macro lens.

Figure 4:
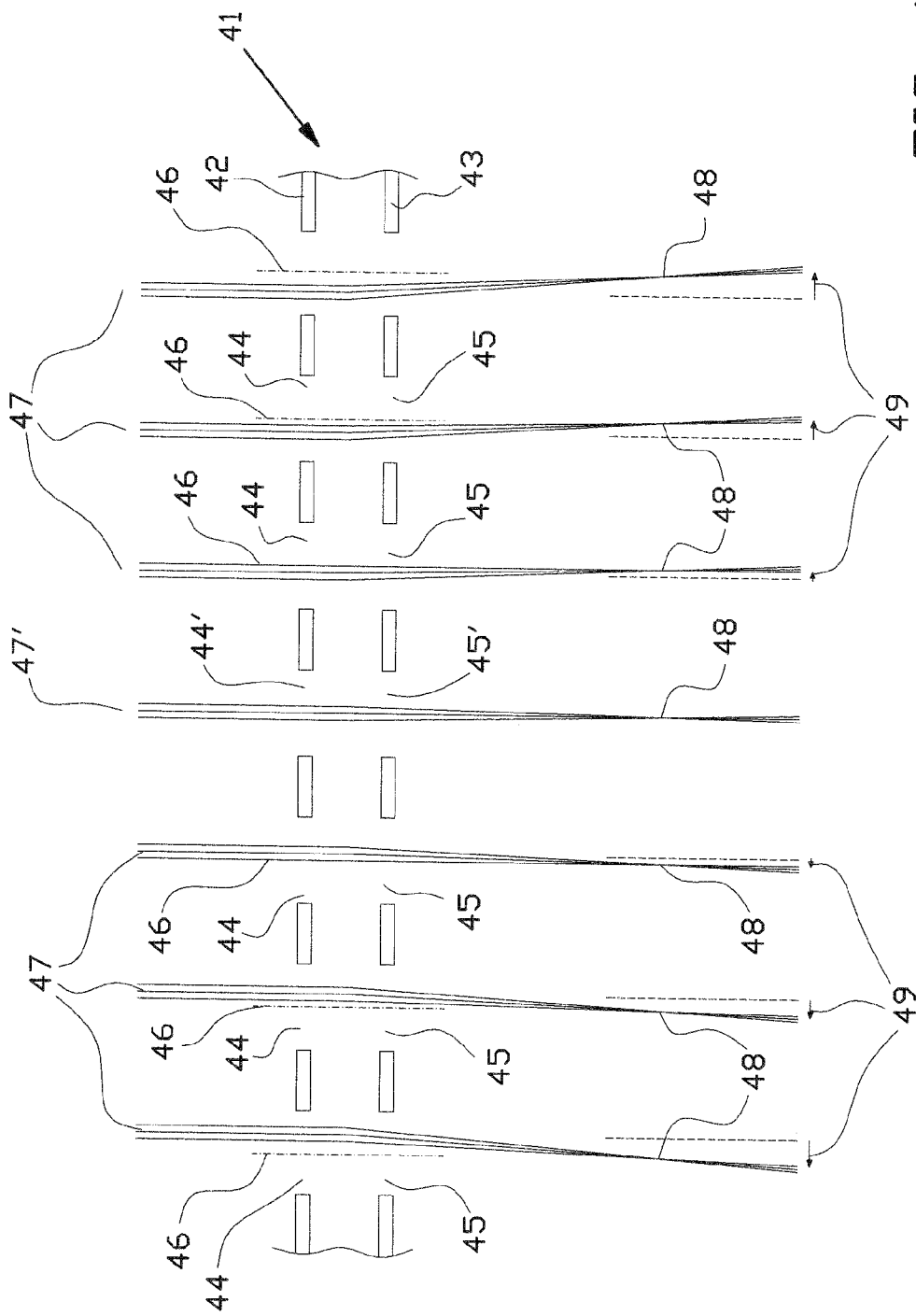
FIG. 4 shows a schematic cross-section of a second exemplary embodiment of a electrostatic lens array of the invention.

A second example is shown in FIG. 4. In this example, the first 42 and second 43 array electrode of said electrostatic lens array 41 is designed such that the spacing between the lens holes 44, 45 is larger than the spacing between the beamlets 47 (again this is highly exaggerated in this figure to more clearly show the effect of deflection). Thus the shift 49 of the beamlets 47 increase with increasing distance between a beamlet 47 en the centre beamlet 47'. Since an electrostatic lens is usually a positive lens, the arrangement shown in FIG. 4 acts as a negative macro lens.

As schematically indicated in FIGS. 3 and 4, the beamlets 37, 47 are not only deflected, but also focused in the focal points 38, 48.

Figure 5:
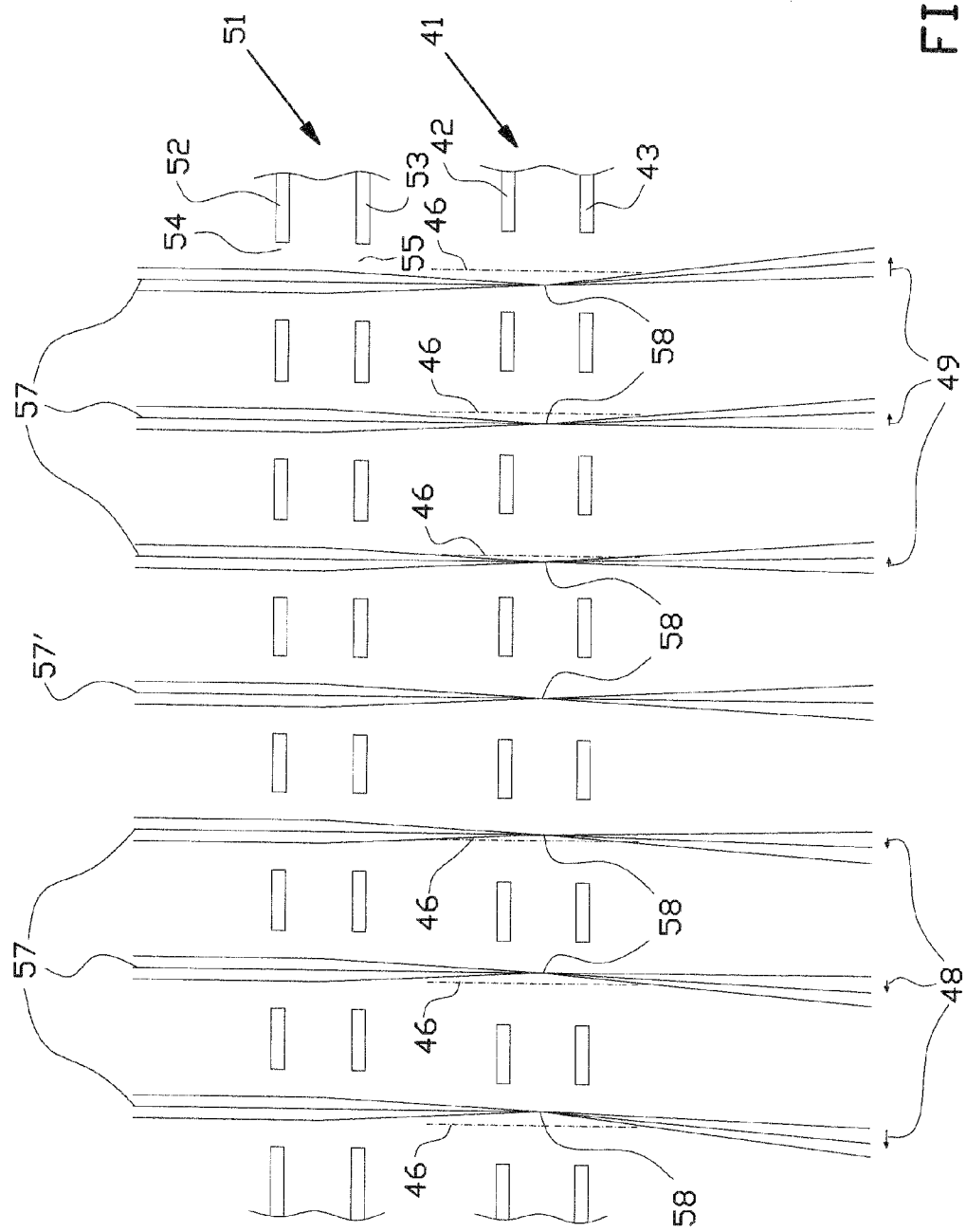
FIG. 5 shows a schematic cross-section of a third exemplary embodiment of a electrostatic lens array of the invention.

A third example, where the focusing effect of the electrostatic lens array 41 of FIG. 4 is minimized, is shown in FIG. 5. In this example, the electrostatic lens array 41 for deflecting the beamlets 57 is arranged near or at a focal point 58 of the beamlets 57. In order to focus the beamlets 57, a further electrostatic lens array 51 is arranged upstream of said electrostatic lens array 41. The further electrostatic lens array 51 is designed and arranged such that all beamlets 57 pass centrally through the lens holes 54, 55 of said further electrostatic lens array 51. Each lenslet of said further electrostatic lens array 51 only focuses the corresponding beamlet 57. Subsequently the beamlets 57 reach the electrostatic lens array 41. This electrostatic lens array 41 is arranged in the plane of focal points 58 of the further electrostatic lens array 51. By placing the electrostatic lens array 41 in the plane of focal points 58, the focusing effect of this electrostatic lens array 41 is minimized. Using this configuration, the deflection 59 of the beamlets can be adjusted by adjusting the voltage difference between the first 42 and second 43 array electrodes, without substantially changing the total focal length of the charged particle optical system. A further advantage of placing the electrostatic lens array 41 in the plane of focal points 58 is that this will also minimize any unwanted aberrations in the off-axis beamlets 57.

Figure 6:
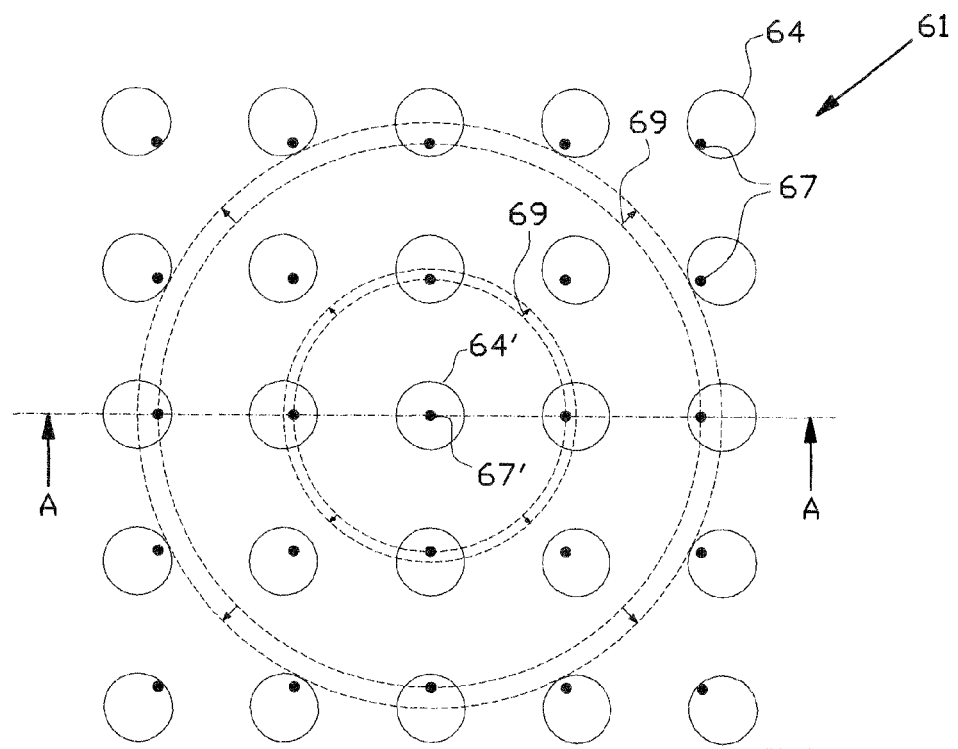
FIG. 6 shows a schematic top-view of a fourth exemplary embodiment of a electrostatic lens array of the invention for use as a macro lens.

FIG. 6 shows a schematic top view of a fourth example of an electrostatic lens array 61, wherein the array electrodes are designed such that the spacing between the lens holes 64 is larger than the spacing between the beamlets 67 this is highly exaggerated in this figure to more clearly show the shift of the lens holes with respect to the beamlets 67). This produces a radial shift 69 of the lens holes 64 with respect to the beamlets 67, which radial shift 69 increases with increasing radial distance between a beamlet 67 en the centre beamlet 67'. Since an electrostatic lens is usually a positive lens, the arrangement shown in FIG. 6 acts as a negative circle symmetric macro lens. FIG. 4 can be regarded as a cross-section along the line A-A in FIG. 6.

Figure 7:
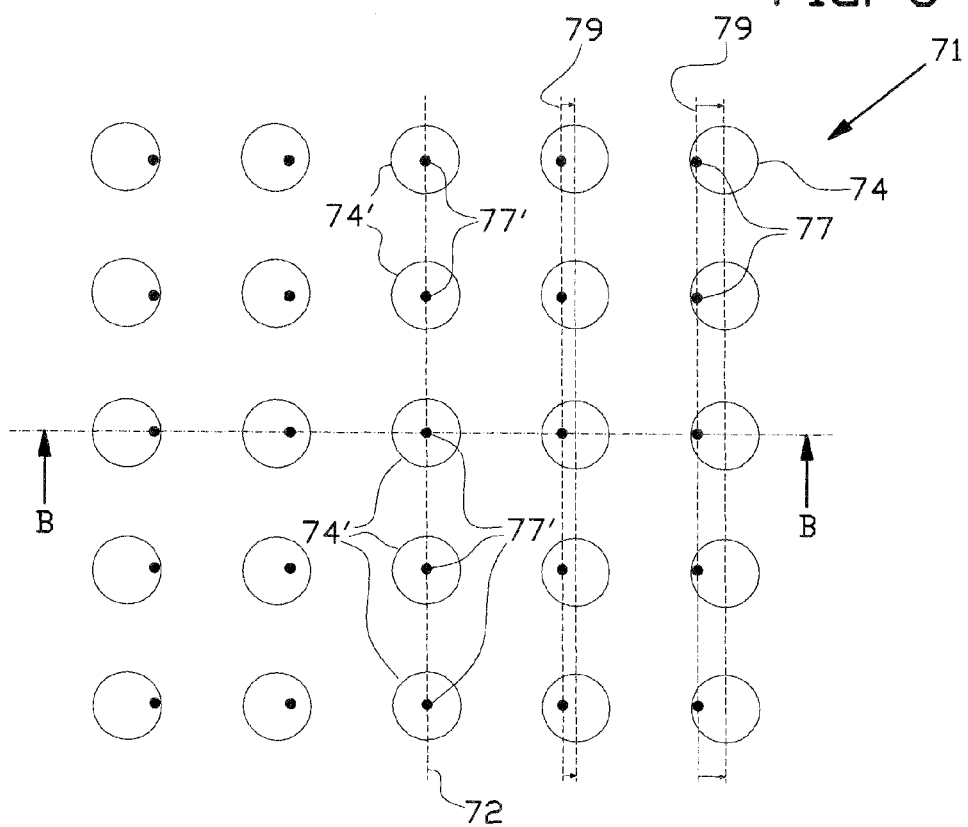
FIG. 7 shows a schematic cross-section of a fifth exemplary embodiment of a electrostatic lens array of the invention for use as a macro cylinder lens.

FIG. 7 shows a schematic top view of a fifth example of an electrostatic lens array 71, wherein the array electrodes are designed such that the spacing between the lens holes 74 in a direction along a symmetry axis 72 is equal to the spacing between the beamlets 77, and the spacing between the lens holes 74 in a direction perpendicular to said symmetry axis 72 is larger than the spacing between the beamlets 77 (this is highly exaggerated in this figure to more clearly show the shift of the lens holes 74 with respect to the beamlets 77). In the direction perpendicular to said symmetry axis 72, this produces a shift 79 of the lens holes 74 with respect to the beamlets 77, which increases with increasing distance between a beamlet 77 en the symmetry axis 72. Since an electrostatic lens is usually a positive lens, the arrangement shown in FIG. 7 acts as a negative cylinder macro lens. FIG. 4 can be regarded as a cross-section along the line B-B in FIG. 7.

Figure 8:
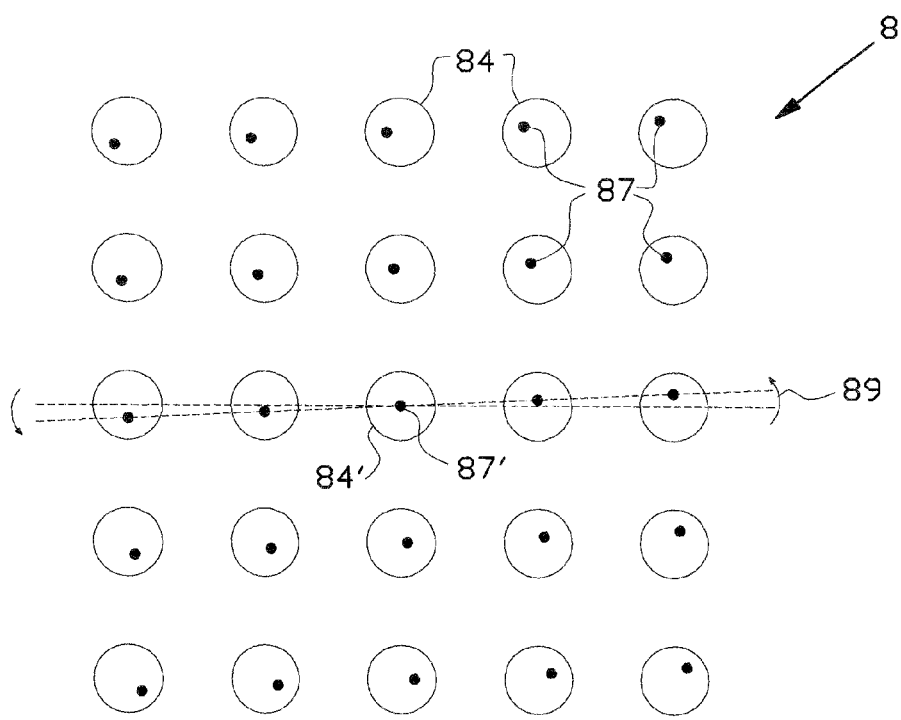
FIG. 8 shows a schematic cross-section of a sixth exemplary embodiment of a electrostatic lens array of the invention for use as a rotator.

FIG. 8 shows a schematic top view of a sixth example of an electrostatic lens array 81, wherein the array electrodes are designed such that the spacing between the lens holes 84 is equal to the spacing between the beamlets 87. However the array of lens holes 84 is rotated anti-clockwise with respect to the array of beamlets 87, around the centre beamlet 87' (this is highly exaggerated in this figure to more clearly show the shift of the lens holes 84 with respect to the beamlets 87). This produces a tangential shift 89 of the lens holes 84 with respect to the beamlets 87, which tangential shift 89 increases with increasing radial distance between a beamlet 87 en the centre beamlet 87'. The arrangement shown in FIG. 8 acts as a rotator for correcting small rotational errors in the alignment of the assembly of beamlets 87, 87' (as schematically shown in FIG. 10B).

Figure 9:
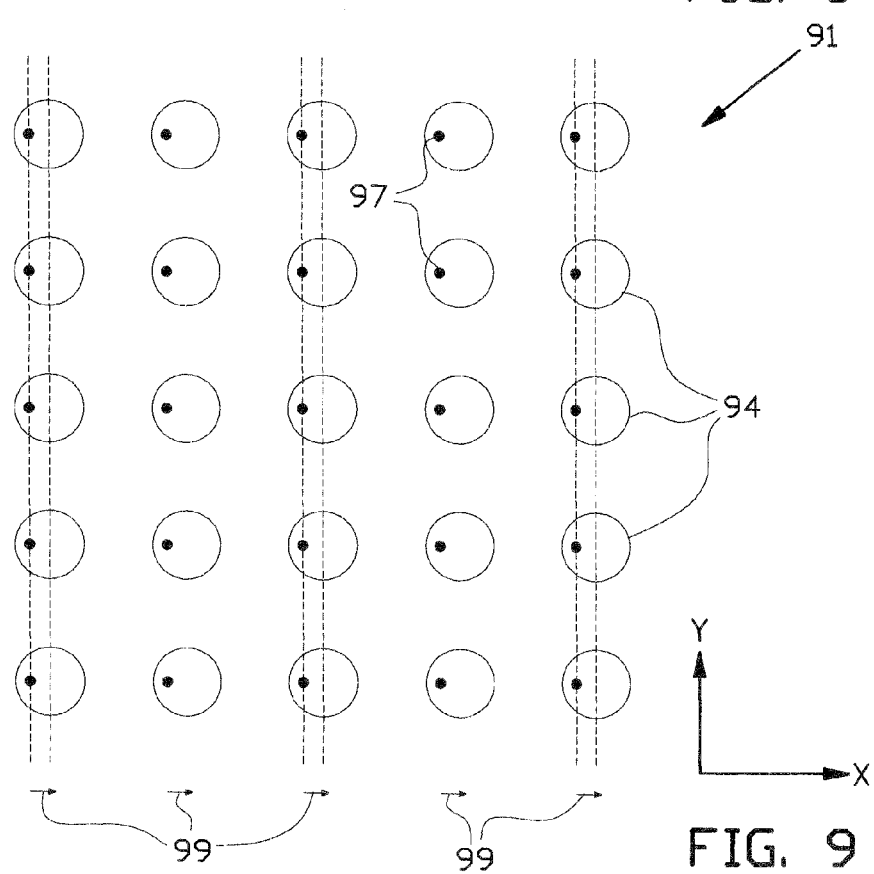
FIG. 9 shows a schematic cross-section of a seventh exemplary embodiment of a electrostatic lens array of the invention for use as a deflector.

FIG. 9 shows a schematic top view of a seventh example of an electrostatic lens array 91, wherein the array electrodes are designed such that the spacing between the lens holes 94 is equal to the spacing between the beamlets 97. However the array of lens holes 94 is shifted along an X-axis with respect to the array of beamlets 97 (this is highly exaggerated in this figure to more clearly show the shift of the lens holes 94 with respect to the beamlets 97). This produces a equal shift 99 of the lens holes 94 with respect to the beamlets 97 along the X-axis. The arrangement shown in FIG. 9 acts as a deflector for deflecting the assembly of beamlets 97 in the direction of the X-axis.

In the same way, the array of lens holes 94 may alternatively be shifted along a Y-axis with respect to the array of beamlets 97. This produces an equal shift 99 of the lens holes 94 with respect to the beamlets 97 along the Y-axis. The arrangement would then act as a deflector for deflecting the assembly of beamlets 97 in the direction of the Y-axis.

Figure 10A:
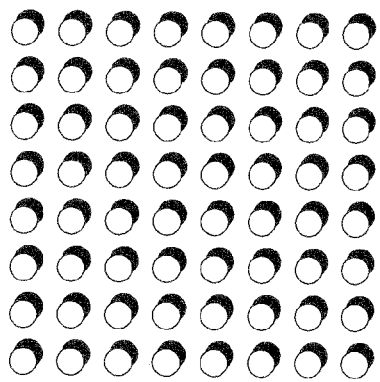
FIG. 10A schematically shows an alignment error solvable with a shift in the XY plane.
Figure 10B:
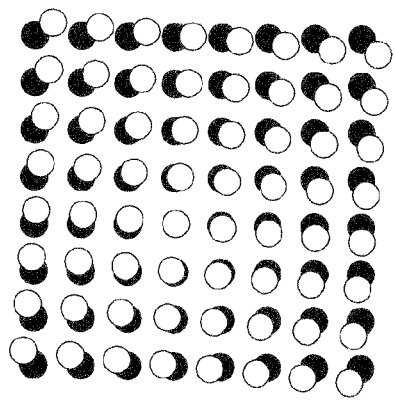
FIG. 10B schematically shows an alignment error solvable with a rotation around a rotation centre in the XY plane.

A combination of an X-axis deflector and a Y-axis deflector can be used for correcting small alignment errors of the assembly of beamlets 87, 87' in the XY-plane (as schematically shown in FIG. 10A).

In the above described third example of FIG. 5, where the focusing effect of the electrostatic lens array is minimized, two electrostatic lens arrays are used, one on-axis electrostatic lens array 51 and one substantially off-axis electrostatic lens array 41. In order to minimize the focusing effect these two lens arrays 41, 51 can also be used differently, as shown in FIGS. 11A and 11B.

FIG. 11A schematically shows a cross section of one lenslet of a first, on-axis electrostatic lens array 101, and one off-axis lenslet of a second, substantially off-axis electrostatic lens array 102. The first 101 and second 102 electrostatic lens arrays are arranged in close proximity and have, when activated, substantially the same focal length. In a first, undeflected situation as shown in FIG. 11A, the first electrostatic lens array 101 is on, and the second electrostatic lens array 102 is off. In a second, deflected situation as shown in FIG. 11B, the first electrostatic lens array 101 is off, and the second electrostatic lens array 102 is on. In both undeflected and deflected situations, the focal length is substantially preserved.

FIG. 12 shows a cross section of an example of a lenslet of an electrostatic lens array 104 comprising three array electrodes 105, 106, 107. The stack of array electrodes of the electrostatic lens array 104 comprises a third array electrode 106 provided with a third lens hole array, wherein the lens holes of the first 105, second 107 and third 106 lens hole array are aligned with each other. A lenslet axis 108 of said electrostatic lenslet runs through the centers of the lens hole of said first 105 and second 107 lens hole array, wherein each off-axis lenslet comprises a off-axis third lens hole of said third lens hole array 106, and wherein the center of said off-axis third lens hole is arranged at a distance from said lenslet axis 108.

Figure 13:
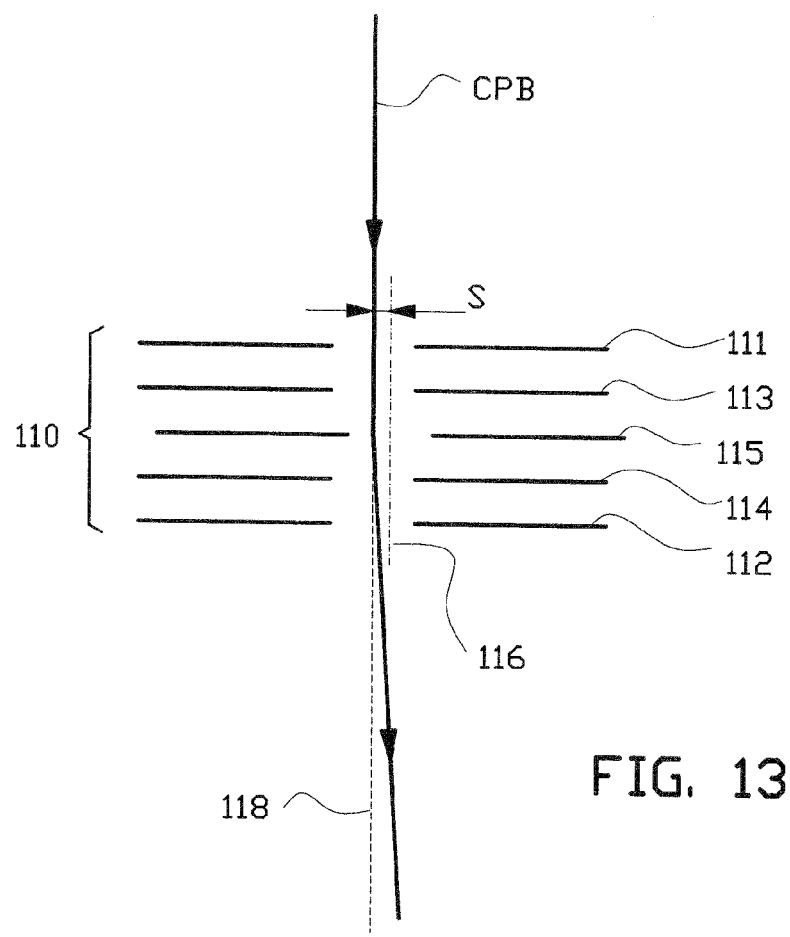
FIG. 13 shows a schematic representation of an exemplary embodiment having a five element lenslet configuration.

FIG. 13 shows a cross section of an example of a lenslet of an electrostatic lens array 110 comprising five array electrodes 111, 113, 115, 114, 112. The stack of array electrodes of the electrostatic lens array 110 comprises a third array electrode 115 provided with a third lens hole array, wherein the lens holes of the lens hole arrays are aligned with each other. A lenslet axis 118 of said electrostatic lenslet runs through the centers of the lens hole of said first 111, second 113, fourth 114 and fifth 112 lens hole array, wherein each off-axis lenslet comprises a off-axis third lens hole of said third lens hole array 115, and wherein the center of said off-axis third lens hole is arranged at a distance from said lenslet axis 118.

The properties of such a five element electrostatic lenslet (as shown in FIG. 13) can be various, but preferably two properties are held constant or must be compensated for during shift change:
1. Focal position.
2. Kinetic energy of the charged particles.

By making use of five element electrostatic lenslets (shown in FIG. 13) in which the middle electrode 115 is being shifted off axis, these properties can be satisfied. By applying a slightly different voltage on the middle electrode, the focal position is shifted in the XY-plane in correspondence with the lens shift and applied voltage. In this exemplary device the focal position and kinetic energy can be maintained, since the system is build up from individual controllable electrodes, which can be seen as individual controllable lenses. The on-axis lenslets in front of or behind the off-axis lenslet can be adjusted to compensate for the focusing effect of the off-axis lenslet.

By applying substantially the same potential to the outermost electrodes of the five element electrostatic lens array, in particular by connecting these electrodes to a substantially earth potential, the kinetic energy of the charged particles in the beamlets before and after said electrostatic lens array have substantially the same magnitude.

Figure 14:
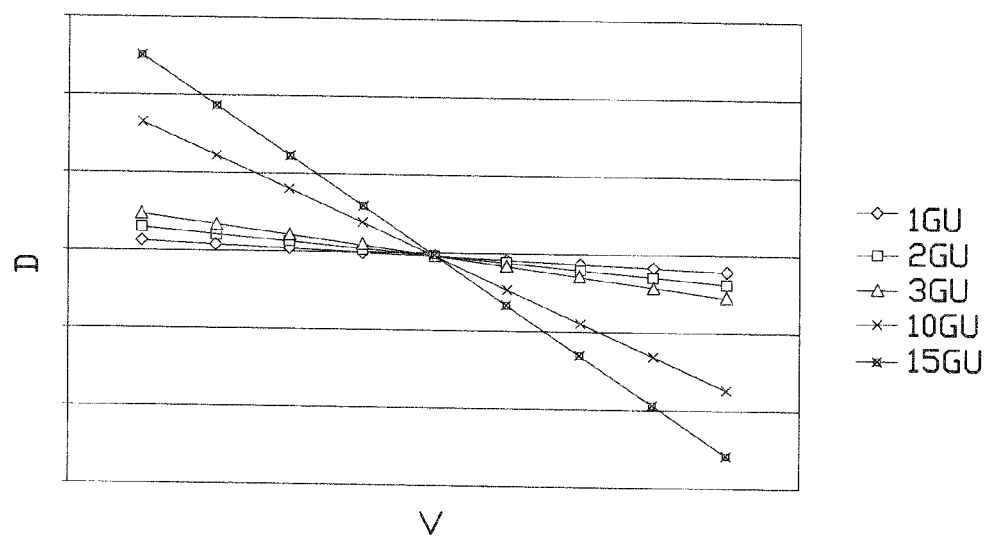
FIG. 14 shows a graph of a beam shift versus applied voltage for the embodiment of FIG. 13.

When small voltage changes are applied on middle electrode 115 in respect to its neighbors 113, 114, a linear shift is seen of the focal point position in the XY-plane. This behavior of the deflection D (vertical axis) as a function of the electrode 15 potential V (horizontal axis), is schematically shown in FIG. 14 for different lens shifts (1GU stands for 2 µm lens shift with respect to the charged beamlet). Data recording is done in the optical axis 118 direction in steps of 2 µm, no focal distance shift and no astigmatism is seen for these plotted points.

Figure 15A:
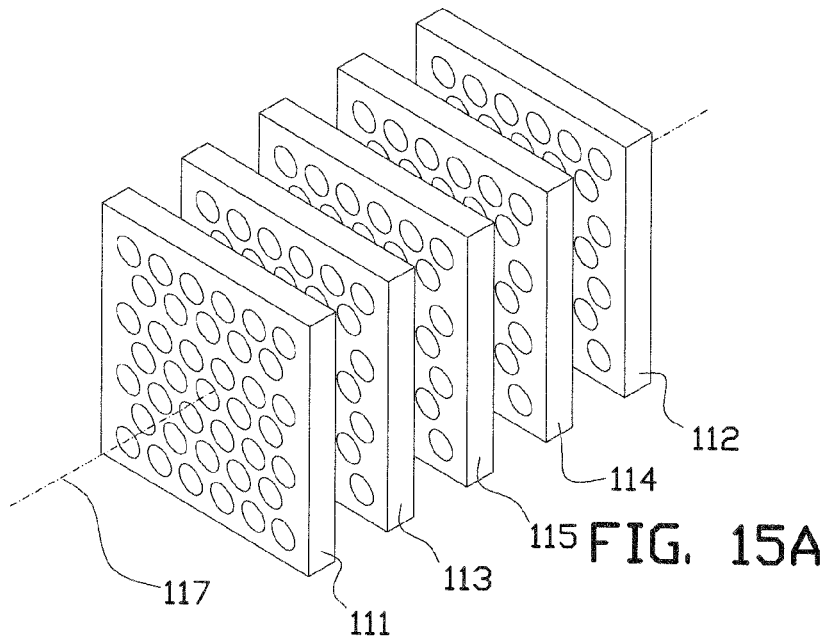
FIG. 15A schematically shows a 3D view of an exemplary embodiment of a five lens hole array configuration.

A multiple beam five element electrostatic lens array is schematically shown in FIG. 15A, wherein the middle array electrode 115 is rotated with respect to the other array electrodes 111, 113, 114, 112. This gives an individual lens shift per beamlet that is proportional to the distance from the system center 117. Thus, it is now possible to correct for rotation misalignment by applying a specific voltage on the middle electrode 115, whereby the central beam does not shift and the introduced shift proportional is to distance from the system center 117.

Figure 16:
FIG. 16 shows a simulation of an induced shift around the middle beamlet using the embodiment of FIG. 6A.

In FIG. 16 an extreme rotation correction is shown in black dots versus no rotation represented by open circles, which shows in simulation a rotated assembly of charged particle beamlets using a rotator according to the example shown in FIG. 8.

Returning now to FIG. 2, the above mentioned examples of electrostatic lens arrays can be employed at various positions in the charged particle optical system 4, thus providing a novel charged particle optical system according to the invention:

The charged particle beam generated by the charged particle source 17 passes collimator lens 19 for collimating the charged particle beam. Next, the collimated charged particle beam is transformed into a plurality of beamlets 22 by the aperture array 21.

In order to correct for any spherical aberration introduced by the collimator lens 19, an electrostatic lens array according to the fourth example as shown in FIG. 6 can be arranged behind the aperture array 21. In this case, the radial shift 69 of the lens holes 64 with respect to the beamlets 67 increases proportional with increasing radial distance between a beamlet 67 en the centre beamlet 67' to the third power.

In order to correct for any astigmatism introduced by the collimator lens 19, an electrostatic lens array according to the fifth example as shown in FIG. 7 can be arranged behind the aperture array 21.

Subsequently, the beamlets 22 are projected on blanking means 23 which in this example comprises an array of apertures provided with deflection means.

Behind the blanking means 23, a rotator according to the sixth example as shown in FIG. 8 can be arranged, for correcting small rotational errors in the alignment of the beamlets 22 with respect to the beam stop 25 such that non-deflected beamlets are able to pass through said beam stop array 25.

The projector 5 behind the beam stop array 25, focuses the non-deflected beamlets 26 and deflects the non-deflected beamlets 26 in a writing direction on the target 9, thus realizing a final projection. According to an aspect of the invention, the projector 5 is provided with a rotator for correcting small rotational errors in the alignment of the beamlets 26 with respect to the target 9. By providing a rotator for correcting small rotational errors, a less accurate, and consequently more economic and/or simple, target position system may be employed.

Figure 15B:
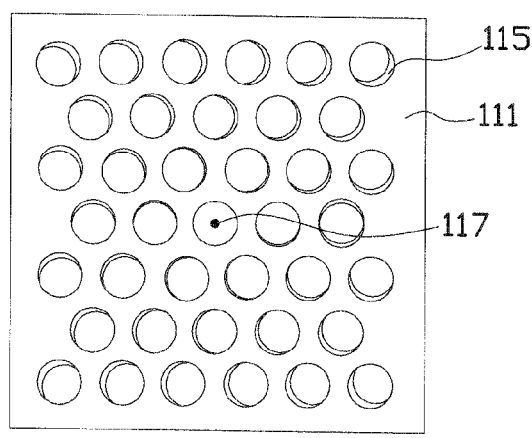
FIG. 15B schematically shows a top-view of the embodiment of FIG. 15A.

In one embodiment the example as shown in FIGS. 15A and 15B can be used as said projector lens 5, in order to provide a rotator for correcting small rotational errors, which rotator is embedded in said projector lens 5.

In an alternative embodiment, the beam stop 25 is arranged directly above the projector 5, and is slightly rotated with respect to the charged particle beamlets 22 according to the example shown in FIG. 8. Usually the beam stop 25 and the top electrode of the projector 5 are earthed. By providing a small potential difference between the beam stop 25 and the top electrode of the projector 5, a rotator analogous to the sixth example as shown in FIG. 8 is obtained.

In addition, the projector 5 can be provided with a deflector according to the seventh example as shown in FIG. 9, for deflecting the beamlets 26 in the writing direction on the target 9. This deflector can be arranged behind the projector 5, but preferably is embedded in the projector 5. This embedded deflector can advantageously be combined with the utilization of the beam stop 25 as part of the rotator as described above.

Fabrication

The electrostatic lens arrays comprises a stack of two or more conducting electrodes separated by non-conducting spacers. The electrodes all have an aligned array of lens hole. Preferably the electrostatic lens arrays are mostly built up from MEMS components, using for example the following method steps:

The starting material for the electrodes is a thin double side polished 4" silicon wafer, that is subsequently covered with a silicon dioxide layer by thermal oxidation. The pattern of the lens holes is defined by optical lithography and this pattern is then transferred to the oxide layer by reactive ion etching. Then the lens holes are etched through the electrode using the oxide as an etch mask in a Bosch DRIE process. After etching, the electrodes are cleaned using a combination of wet and dry processes and coated by sputter deposition.

The starting material for the non-conducting spacers is a thin double side polished 4" glass wafer that is diced to the required size. Mechanical drilling makes the central hole. Finally the spacers are cleaned using a combination of wet and dry processes.

Since the alignment of the electrodes in the stack is crucial for the functioning of the device a dedicated add-on was developed for a Karl Suzz mask aligner allowing for accurate positioning of the electrodes during the stacking and gluing sequence. The two or more array-electrodes are aligned with sub 500 nm precisions.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

The invention claimed is:

1. Multiple beam charged particle optical system comprising:
   a charged particle source for generating a plurality of charged particle beamlets,
   charged particle optics for directing the charged particle beamlets from the charged particle source towards a target, wherein each charged particle beamlet defines a beamlet centre line,
   said charged particle optics comprising one or more electrostatic lens arrays, each comprising two or more array electrodes for generating a plurality of electrostatic lenslets, wherein each lenslet is arranged for focusing a corresponding charged particle beamlet, and wherein each lenslet defines a lenslet optical axis, characterized in that
   at least one of said one or more electrostatic lens arrays comprises one or more off-axis electrostatic lenslets, wherein the beamlet centre line of the corresponding charged particle beamlet passes through said off-axis electrostatic lenslet at a distance from its lenslet optical axis.

2. Multiple beam charged particle optical system comprising:
   a charged particle source for generating a plurality of charged particle beamlets,
   charged particle optics for directing the charged particle beamlets from the charged particle source towards a target, wherein each charged particle beamlet defines a beamlet centre line,
   said charged particle optics comprising one or more electrostatic lens arrays, each comprising two or more array electrodes for generating a plurality of electrostatic lenslets, wherein each lenslet is arranged for focusing a corresponding charged particle beamlet, and wherein each lenslet defines a lenslet optical axis,
   wherein at least one of said one or more electrostatic lens arrays comprises a stack comprising a first and second array electrode provided with a first and second lens hole array, respectively, wherein the lens holes of the first and second lens hole array are aligned with each other,
   wherein at least one of said one or more electrostatic lens arrays comprises one or more off-axis electrostatic lenslets, each off-axis lenslet comprising a first lens hole of said first lens hole array and an opposite second lens hole of said second lens hole array, and
   wherein the beamlet centre line of the corresponding charged particle beamlet passes through said off-axis electrostatic lenslet at a distance from a centre of said off-axis electrostatic lenslet.

3. Multiple beam charged particle optical system according to claim 1 or 2, wherein each one or a subset of said one or more off-axis electrostatic lenslets is individually adjusted and/or arranged for providing an individual correction, or desired deflection or position of each corresponding charged particle beamlet.

4. Multiple beam charged particle optical system according to claim 1 or 2, the charged particle optics comprising a central axis, wherein the plurality of lenslets of the at least one of said one or more electrostatic lens arrays is substantially symmetrically arranged around said central axis.

5. Multiple beam charged particle optical system according to claim 4, wherein the distance between the optical axis of each off-axis electrostatic lenslet and the beamlet centre line of the corresponding charged particle beamlet is a function of the radial distance between said off-axis electrostatic lenslet and the central axis.

6. Multiple beam charged particle optical system according to claim 5, wherein the distance between the optical axis of each off-axis electrostatic lenslet and the beamlet centre line of the corresponding charged particle beamlet is proportional to the radial distance between said off-axis electrostatic lenslet and the central axis.

7. Multiple beam charged particle optical system according to claim 5, wherein the distance between the optical axis of each off-axis electrostatic lenslet and the beamlet centre line of the corresponding charged particle beamlet is proportional to the radial distance between said off-axis electrostatic lenslet and the central axis to the third power.

8. Multiple beam charged particle optical system according to claim 3, wherein each off-axis electrostatic lenslet is shifted with respect to the beamlet centre line of the corresponding charged particle beamlet in substantially the same direction.

9. Multiple beam charged particle optical system according to claim 4, wherein each off-axis electrostatic lenslet is shifted with respect to the beamlet centre line of the corresponding charged particle beamlet in a substantially radial direction with respect to said central axis.

10. Multiple beam charged particle optical system according to claim 4, wherein each off-axis electrostatic lenslet is shifted with respect to the beamlet centre line of the corresponding charged particle beamlet in a substantially tangential direction with respect to said central axis.

11. Multiple beam charged particle optical system according to claim 3, wherein each off-axis electrostatic lenslet of a quadrant of the at least one of said one or more electrostatic lens arrays is shifted with respect to the beamlet centre line of the corresponding charged particle beamlet in substantially the same direction.

12. Multiple beam charged particle optical system according to claim 1 or 2, wherein each off-axis electrostatic lenslet is shifted in substantially the same direction and wherein the distance between the optical axis of each off-axis electrostatic lenslets and the beamlet centre line of the corresponding charged particle beamlet is substantially constant.

13. Multiple beam charged particle optical system according to claim 1 or 2, wherein an off-axis electrostatic lenslet is embedded in, set in front of or behind an on-axis electrostatic lenslet of said charged particle optics.

14. Multiple beam charged particle optical system according to claim 2, wherein the stack comprises a third array electrode provided with a third lens hole array, wherein the lens holes of the first, second and third lens hole arrays are aligned with each other,
wherein a lenslet axis of said electrostatic lens runs through the centers of said first and second lens hole,
wherein each off-axis lenslet comprises a third lens hole of said third lens hole array, and wherein the center of said third lens hole is arranged at a distance from said lenslet axis.

15. Multiple beam charged particle optical system according to claim 14, wherein the second array electrode is arranged between the first and third array electrode.

16. Multiple beam charged particle optical system according to claim 14, wherein the third array electrode is arranged between the first and second array electrode.

17. Multiple beam charged particle optical system according to claim 14, the charged particle optics comprising a central axis, wherein the plurality of lenslets of the at least one of said one or more electrostatic lens arrays are substantially symmetrically arranged around said central axis.

18. Multiple beam charged particle optical system according to claim 17, wherein the distance between the center of said third lens hole and said lenslet axis is a function of the radial distance between said off-axis electrostatic lenslet and the central axis.

19. Multiple beam charged particle optical system according to claim 17, wherein the distance between the center of said third lens hole and said lenslet axis is proportional to the radial distance between said off-axis electrostatic lenslet and the central axis.

20. Multiple beam charged particle optical system according to claim 17, wherein the distance between the center of said third lens hole and said lenslet axis is proportional to the radial distance between said off-axis electrostatic lenslet and the central axis to the third power.

21. Multiple beam charged particle optical system according to claim 14, wherein the third lens hole of each off-axis electrostatic lenslet is shifted with respect to the beamlet centre line of the corresponding charged particle beamlet in substantially the same direction.

22. Multiple beam charged particle optical system according to claim 17, wherein the third lens hole of each off-axis electrostatic lenslet is shifted with respect to the beamlet centre line of the corresponding charged particle beamlet in a substantially radial direction with respect to said central axis.

23. Multiple beam charged particle optical system according to claim 17, wherein the third lens hole of each off-axis electrostatic lenslet is shifted with respect to the beamlet centre line of the corresponding charged particle beamlet in a substantially tangential direction with respect to said central axis.

24. Multiple beam charged particle optical system according to claim 14, wherein the third lens hole of each off-axis electrostatic lenslet of a quadrant of the at least one of said one or more electrostatic lens arrays is shifted with respect to the beamlet centre line of the corresponding charged particle beamlet in substantially the same direction.

25. Multiple beam charged particle optical system according to claim 14, wherein the third lens hole of each off-axis electrostatic lenslet is shifted in substantially the same direction, and wherein the distance between the center of said third lens hole and said lenslet axis is substantially constant.

26. Multiple beam charged particle optical system according to claim 14, wherein the stack comprises a fourth and fifth array electrode provided with a fourth and fifth lens hole array, respectively, wherein the lens holes of the first, second, third, fourth and fifth lens hole array are aligned with each other,
wherein the lenslet axis of said electrostatic lens runs through the centers of said aligned first, second, fourth and fifth lens holes, and
wherein the third lens hole array is arranged in between the first and second lens hole array on the one side and the fourth and fifth lens hole array on the other side.

27. Multiple beam charged particle optical system according to claim 14, wherein said electrostatic lens array comprises an array of substantially parallel lens axes.

28. Multiple beam charged particle optical system according to claim 17, wherein the third lens hole array is rotated around the central axis with respect to the first and/or second lens hole array.

29. Multiple beam charged particle optical system according to claim 1 or 2, wherein the system further comprises
- a sensor for accurately determining a deviation between an actual position and a desired position of the target, and
- a controller for adjusting a potential of said off-axis lenslet or said third array electrode based on the determined deviation.

30. Maskless charged particle beam lithography assembly comprising a multiple beam charged particle optical system according to claim 1 or 2.

31. Electrostatic lens array comprising one or more off-axis electrostatic lenslets, for use in a multiple beam charged particle optical system according to claim 1 or 2.

32. Use of a multiple beam charged particle optical system according to claim 1 or 2, for generating a plurality of charged particle beamlets and for directing the charged particle beamlets from the charged particle source towards a target.

* * * * *